United States Patent
Kitajima et al.

(10) Patent No.: US 7,772,070 B2
(45) Date of Patent: Aug. 10, 2010

(54) SEMICONDUCTOR INTEGRATED CIRCUIT DEVICE AND DUMMY PATTERN ARRANGEMENT METHOD

(75) Inventors: Hiroyasu Kitajima, Kanagawa (JP); Hiroshi Furuta, Kanagawa (JP); Toshikatsu Jinbo, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 723 days.

(21) Appl. No.: 11/711,783

(22) Filed: Feb. 28, 2007

(65) Prior Publication Data

US 2007/0221957 A1 Sep. 27, 2007

(30) Foreign Application Priority Data

Mar. 15, 2006 (JP) ............................ 2006-070203

(51) Int. Cl.
*H01L 21/8234* (2006.01)

(52) U.S. Cl. .................. 438/275; 438/197; 438/200; 438/587; 257/365; 257/371; 257/390; 257/E27.081; 257/E21.615

(58) Field of Classification Search .............. 257/365, 257/368, 369, 371, 372, 377, 382, 390, 401, 257/E29.112, E29.169, E29.325, E29.126, 257/E29.127, E29.128, E29.134, E29.136, 257/E21.177, E21.191, E21.615, E21.616, 257/E21.619, E21.62, E21.634, 374, 510, 257/E27.07, E27.081, E21.598; 438/183, 438/200, 213, 275, 279, 587, 926, 197, 199, 438/221, 296, 424
See application file for complete search history.

(56) References Cited

U.S. PATENT DOCUMENTS

| | | | | |
|---|---|---|---|---|
| 5,729,040 | A * | 3/1998 | Sano | 257/504 |
| 5,909,628 | A * | 6/1999 | Chatterjee et al. | 438/424 |
| 6,121,078 | A * | 9/2000 | DeBrosse et al. | 438/183 |
| 6,838,736 | B2 | 1/2005 | Ishikura et al. | |
| 7,171,645 | B2 * | 1/2007 | Ito et al. | 716/19 |
| 2003/0183860 | A1 * | 10/2003 | Uchiyama et al. | 257/296 |
| 2005/0064634 | A1 * | 3/2005 | Schmidt et al. | 438/183 |
| 2008/0105904 | A1 * | 5/2008 | Sumikawa et al. | 257/202 |
| 2008/0116526 | A1 * | 5/2008 | Amishiro et al. | 257/379 |
| 2008/0128924 | A1 * | 6/2008 | Liu et al. | 257/797 |
| 2008/0258201 | A1 * | 10/2008 | Baba et al. | 257/316 |
| 2008/0283970 | A1 * | 11/2008 | Uchiyama et al. | 257/620 |
| 2009/0072346 | A1 * | 3/2009 | Tomita | 257/510 |

FOREIGN PATENT DOCUMENTS

JP 2002-190516 A 7/2002

\* cited by examiner

*Primary Examiner*—Matthew C Landau
*Assistant Examiner*—Joseph C Nicely
(74) *Attorney, Agent, or Firm*—Foley & Lardner LLP

(57) ABSTRACT

A semiconductor integrated circuit device according to an embodiment of the present invention includes a functional circuit region including a functional circuit, a dummy region formed in a region other than the functional circuit region, and plural dummy MOSFETs formed in a dummy region and having a dummy gate electrode on a dummy diffusion layer, the plural dummy MOSFETs being arranged such that date rates of the dummy diffusion layer and dummy gate electrode are kept constant in a predetermined section.

19 Claims, 12 Drawing Sheets

SEMICONDUCTOR INTEGRATED CIRCUIT DEVICE AND DUMMY PATTERN ARRANGEMENT METHOD

BACKGROUND OF THE INVENTION

1. Field of the Invention

The present invention relates to a semiconductor integrated circuit device and a dummy pattern arrangement method, and more particularly to a semiconductor integrated circuit device including a functional circuit region and a dummy region, and a dummy pattern arrangement method.

2. Description of Related Art

From past to now, in a manufacturing process of a semiconductor integrated circuit device, CMP (Chemical Mechanical Polishing) has been used to planarize a buried insulating film for STI (Shallow Trench Isolation), an interlayer insulating film, or the like.

To explain the CMP, surface flatness of an object to be polished reduces due to its pattern density after polishing. That is, the surface flatness is high in a region with a high base pattern density and is low in a region with a low base pattern density. This is because dishing occurs in the density with a low base pattern density. If the insulating film is too polished due to dishing, the following problem arises. That is, pattern short-circuiting occurs upon processing a metal layer overlying the insulating film. To that end, dummy patterns, which do not electrically function, are arranged in the region with a low base pattern density in order to avoid dishing regarding CMP.

FIG. 9 is a plan view of a conventional semiconductor integrated circuit device having dummy patterns. FIG. 10 is a sectional view taken along the line 10A-10A of FIG. 9. As shown in FIGS. 9 and 10, a conventional semiconductor integrated circuit device 900 includes functional circuit regions 920 (920a and 920b) and a dummy region 910. The dummy region 910 is sandwiched between the functional circuit regions 920.

The functional circuit region 920a is formed in a region 941 of a semiconductor substrate 931, which has no well formed on a main surface of the substrate. In other words, the functional circuit region 920a is positioned at the left side of a well separation line 901 as viewed from the front. The functional circuit region 920b is formed in a region 942 having a well 932 formed on the main surface of the semiconductor substrate 931. In other words, the functional circuit region 920b is positioned at the right side of a well separation line 901 as viewed from the front.

MOSFETs 921 (921a and 921b) are formed in the functional circuit regions 920 (920a and 920b). The MOSFET 921 has gate electrodes 923 (923a and 923b) on source/drain diffusion layers 922 (922a and 922b). Contact diffusion layers 924 (sub-contact diffusion layer 924a and well contact diffusion layer 924b) are formed around the MOSFETs 921.

In the dummy region 910, plural square dummy gate electrodes 911 and dummy diffusion layers 912 are arranged. The dummy diffusion layers 912 are formed together with the source/drain diffusion layers 922 and the contact diffusion layers 924 of the functional circuit regions 920. The dummy gate electrodes 911 are formed together with the gate electrodes 923 of the functional circuit regions 920.

A buried insulating film 934 separates the MOSFETs in the functional circuit regions 920 from one another. Likewise, a buried insulating film 934 separates dummy patterns in the dummy region 910 from one another. Further, the main surface of the semiconductor substrate 931 is covered with an interlayer insulating film 933.

FIG. 11 shows an example of a data rate of dummy patterns in the conventional semiconductor integrated circuit device. The term data rate refers to a data density or area density of the patterns in a predetermined region or predetermined section (predetermined unit region).

Assuming that each dummy diffusion layer 912 is 1 μm×1 μm, and a pitch between the dummy diffusion layers is 1.6 μm×1.6 μm, a data rate is about 39% {(1×1)/(1.6×1.6)=39%}. Assuming that each dummy gate electrode 911 is 1.4 μm×1.4 μm, and a pitch between the gate electrodes is 1.9 μm×1.9 μm, a data rate is about 54% {(1.4×1.4)/(1.9×1.9)=about 54%}.

In the conventional semiconductor integrated circuit device 900, the dummy diffusion layers 912 are arranged in lattice. The flatness of the buried insulating film 934 in the dummy region 910 is thereby improved. Further, the dummy gate electrodes 911 are arranged in lattice. The flatness of the interlayer insulating film 933 in the dummy region 910 is thereby improved.

As the conventional semiconductor integrated circuit device having dummy patterns, a device disclosed in Japanese Unexamined Patent Publication No. 2002-190516 has been known. In the device disclosed in Japanese Unexamined Patent Publication No. 2002-190516, dummy patterns are electrically connected as a countermeasure against noises. However, a data rate of the dummy patterns is not considered.

By the way, a data rate of a dummy diffusion layer as dummy patterns and a data rate of a dummy gate electrode as dummy patterns are separately set in the conventional semiconductor integrated circuit device. That is, upon designing dummy patterns with CAD tools, only patterns for a dummy diffusion layer are automatically arranged to satisfy data rate of the dummy diffusion layer, and only patterns for a dummy gate electrode are automatically arranged to satisfy data rate of the dummy gate electrode.

In the case where the data rate of the diffusion layer and the data rate of the gate electrode are separately determined in this way, the degree of freedom of arrangement of dummy diffusion layer patterns or gate electrode patterns is lowered upon connecting dummy patterns electrically, or a data rate of a predetermined region is changed and reduced. This causes such problem that in the case of connecting dummy patterns electrically, a desired effect or beneficial effect of dummy patterns cannot be obtained in a CMP step.

SUMMARY OF THE INVENTION

A semiconductor integrated circuit device according to an aspect of the invention includes: a functional circuit region formed on a semiconductor substrate; a dummy region formed on the semiconductor substrate; and a plurality of dummy MOSFETs arranged in the dummy region, each of the dummy MOSFETs having a dummy diffusion region and a dummy gate electrode region, wherein a first data rate of the dummy diffusion region arranged in a predetermined section and a second data rate of the dummy gate electrode region arranged in the predetermined section is substantially constant.

According to the semiconductor integrated circuit device, dummy MOSFETs are arranged in a dummy region at a constant data rate for each MOSFET pattern. Even if a contact is formed in dummy patterns, reduction in data rate of the dummy diffusion layer and dummy gate electrode can be prevented.

A dummy pattern arrangement method according to another aspect of the invention includes: arranging a functional circuit region on a semiconductor substrate; and arranging a plurality of dummy MOSFETs in a dummy region on the semiconductor substrate, each of the dummy MOSFETs having a dummy diffusion region and a dummy gate electrode region, and the plurality of dummy MOSFETs are arranged in a manner such that a first data rate of the dummy diffusion region arranged in a predetermined section and a second data rate of the dummy gate electrode region arranged in the predetermined section is set substantially constant.

According to the dummy pattern arrangement method, dummy MOSFETs are arranged in a dummy region at a constant data rate for each MOSFET pattern. Even if a contact is formed in dummy patterns, reduction in data rate of the dummy diffusion layer and dummy gate electrode can be prevented.

According to the present invention, it is possible to use dummy patterns efficiently while connecting the patterns electrically and to suppress change in data rate of the pattern in a predetermined region. Therefore, a semiconductor integrated circuit device and a dummy pattern arrangement method which utilizes a predetermined region of a semiconductor chip except for a functional circuit region is realized.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

First, a semiconductor integrated circuit device according to a first embodiment of the present invention is described.

The semiconductor integrated circuit device of this embodiment has a feature that plural dummy MOSFETs are arranged in dummy regions on a dummy MOSFET basis, and a predetermined potential is applied to a dummy diffusion layer.

Figure 1:
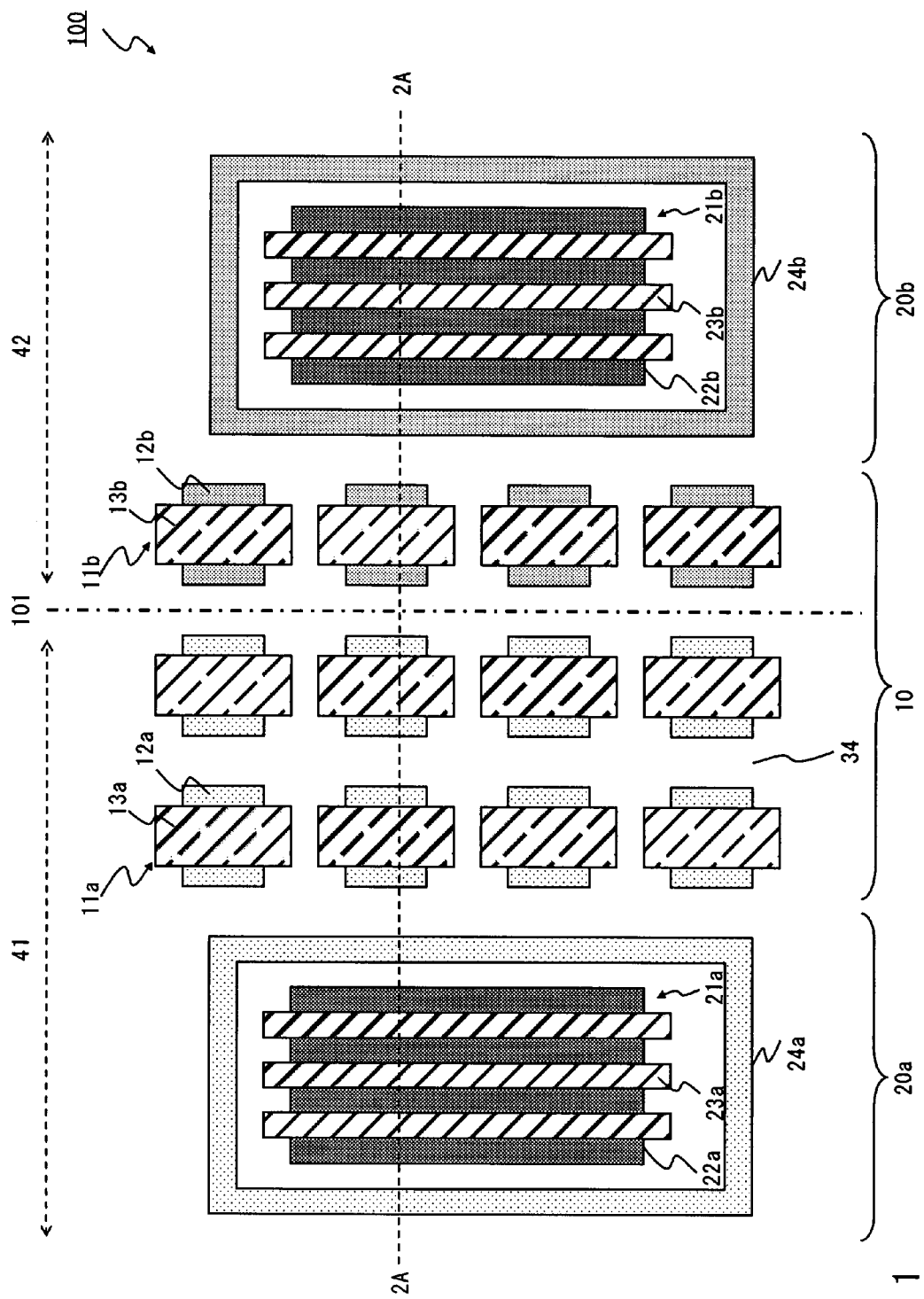
FIG. 1 is a plan view of a semiconductor integrated circuit device according to a first embodiment of the present invention.
Figure 2:
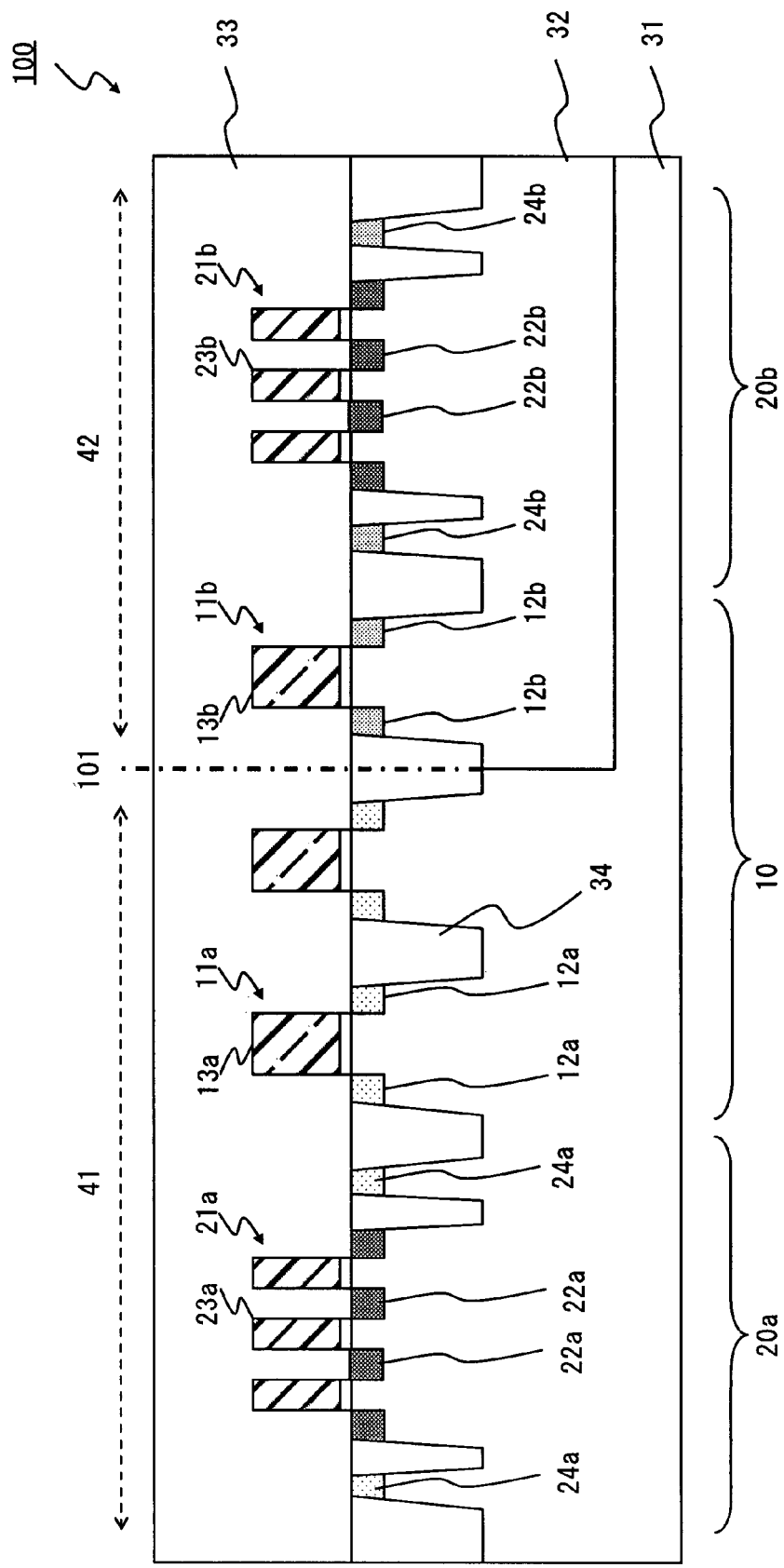
FIG. 2 is a sectional view of the semiconductor integrated circuit device of the first embodiment.

Referring to FIGS. 1 and 2, the structure of the semiconductor integrated circuit device of this embodiment is described as below. FIG. 1 is a plan view of a semiconductor integrated circuit device 100. FIG. 2 is a sectional view taken along the line 2A-2A of FIG. 1. As shown in FIGS. 1 and 2, the semiconductor integrated circuit device 100 includes functional circuit regions 20 (20a and 20b) containing a predetermined functional circuit and a dummy region 10 containing dummy patterns and provided between the functional circuit regions 20 (20a and 20b).

A semiconductor substrate 31 is a P-type semiconductor substrate. On the main surface of the semiconductor substrate 31, a well 32 is selectively formed. Incidentally, a region containing the well 32 is separated from the other regions by a well separation line 101. The well 32 is an N-type well.

The functional circuit region (first functional circuit region) 20a is formed in a region 41 of the semiconductor substrate 31, which contains no well. In other words, the functional circuit region 20a is positioned at the left side of the well separation line 101 as viewed from the front. The functional circuit region (second functional circuit region) 20b is formed in the region 42 containing a well. In other words, the functional circuit region 20b is positioned at the right side of the well separation line 101 as viewed from the front.

MOSFETs 21 (21a and 21b) are formed in the functional circuit regions 20 (20a and 20b). Incidentally, in practice, plural MOSFETs constituting a predetermined functional circuit are arranged inside the functional circuit regions 20. The MOSFET (Metal Oxide Semiconductor Field Effect Transistor) 21 has gate electrodes 23 (23a and 23b). The gate electrodes 23 (23a and 23b) are formed above source/drain diffusion layers 22 (22a and 22b) via a gate oxide film. The source/drain diffusion layer 22a is an N-type diffusion layer; its conductivity type is opposite to that of the semiconductor substrate 31. The source/drain diffusion layer 22b is a P-type diffusion layer; its conductivity type is opposite to that of the well 32.

Contact diffusion layers 24 (sub-contact diffusion layer 24a and well contact diffusion layer 24b) are formed around the MOSFETs 21. The sub-contact diffusion layer 24 is a P-type diffusion layer; its conductivity type is the same as that of the semiconductor substrate 31. The well contact diffusion layer 24b is an N-type diffusion layer; its conductivity type is the same as that of the well 32.

The sub-contact diffusion layer 24a is connected to a predetermined electrode through a contact (not shown) to apply a substrate potential (sub-potential) to the semiconductor substrate 31. The well contact diffusion layer 24b is connected to a predetermined electrode through a contact (not shown) to apply a well potential to the well 32.

Plural dummy MOSFETs 11 (11a and 11b) are arranged in the dummy region 10. The dummy MOSFET 11 has substantially the same structure as the MOSFET. That is, the dummy MOSFET 11 includes dummy diffusion layers 12 (12a and 12b) and dummy gate electrodes 13 (13a and 13b). The dummy diffusion layers 12 (12a and 12b) are formed in the semiconductor substrate 31 or well 32 similar to the source/drain diffusion layer. Further, the dummy gate electrodes 13 (13a and 13b) are formed between the dummy diffusion layers 12 formed in the semiconductor substrate 31 or well 32. Incidentally, the dummy gate electrodes 13 are formed on the main surface of the semiconductor substrate 31 through a gate oxide film.

In the functional circuit region 20, the MOSFETs are separated from one another by the buried insulating film 34. In the dummy region 10, the dummy patterns are separated from one another by the buried insulating film 34. An interlayer insulating film 33 is formed on the main surface of the semiconductor substrate 31.

The dummy diffusion layers 12 of the dummy MOSFETs 11 are formed together with the source/drain diffusion layers 22 and the contact diffusion layers 24 in the functional circuit regions 20. The dummy gate electrodes 13 of the dummy MOSFETs 11 are formed together with the gate electrodes 23 of the functional circuit regions 20.

The dummy diffusion layers 12 of the dummy MOSFETs 11 are formed in a lattice shape on the main surface of the semiconductor substrate 31. Hence, the flatness of the buried insulating film 34 of the dummy region 10 can be improved. The dummy gate electrodes 11 of the dummy MOSFETs 11 are formed in a lattice shape on the main surface of the semiconductor substrate 31. Hence, the flatness of the interlayer insulating film 33 of the dummy region 10 can be improved.

In this embodiment, the dummy diffusion layer 12 of the dummy MOSFET 11 is used as a contact diffusion layer for supplying a reference potential. Incidentally, the contact may be formed in one or both of the dummy source/drain diffusion layers 12.

The dummy diffusion layers 12 have the same conductivity type as that of the semiconductor substrate 31 or well 32 for supplying a reference potential to the semiconductor substrate 31 or well 32. The dummy diffusion layer 12a is a P-type diffusion layer; its conductivity type is the same as that of the semiconductor substrate 31. The dummy diffusion layer 12b is an N-type diffusion layer; its conductivity type is the same as that of the well 32.

The dummy diffusion layer 12a is connected to a predetermined electrode through a contact (not shown). The dummy diffusion layer 12a functions as a sub-contact diffusion layer for supplying a substrate potential to the semiconductor substrate 31. The dummy diffusion layer 12b is also connected to a predetermined electrode through a contact (not shown). The dummy diffusion layer 12b functions as a well contact diffusion layer for supplying a well potential to the well 32.

Figure 3:
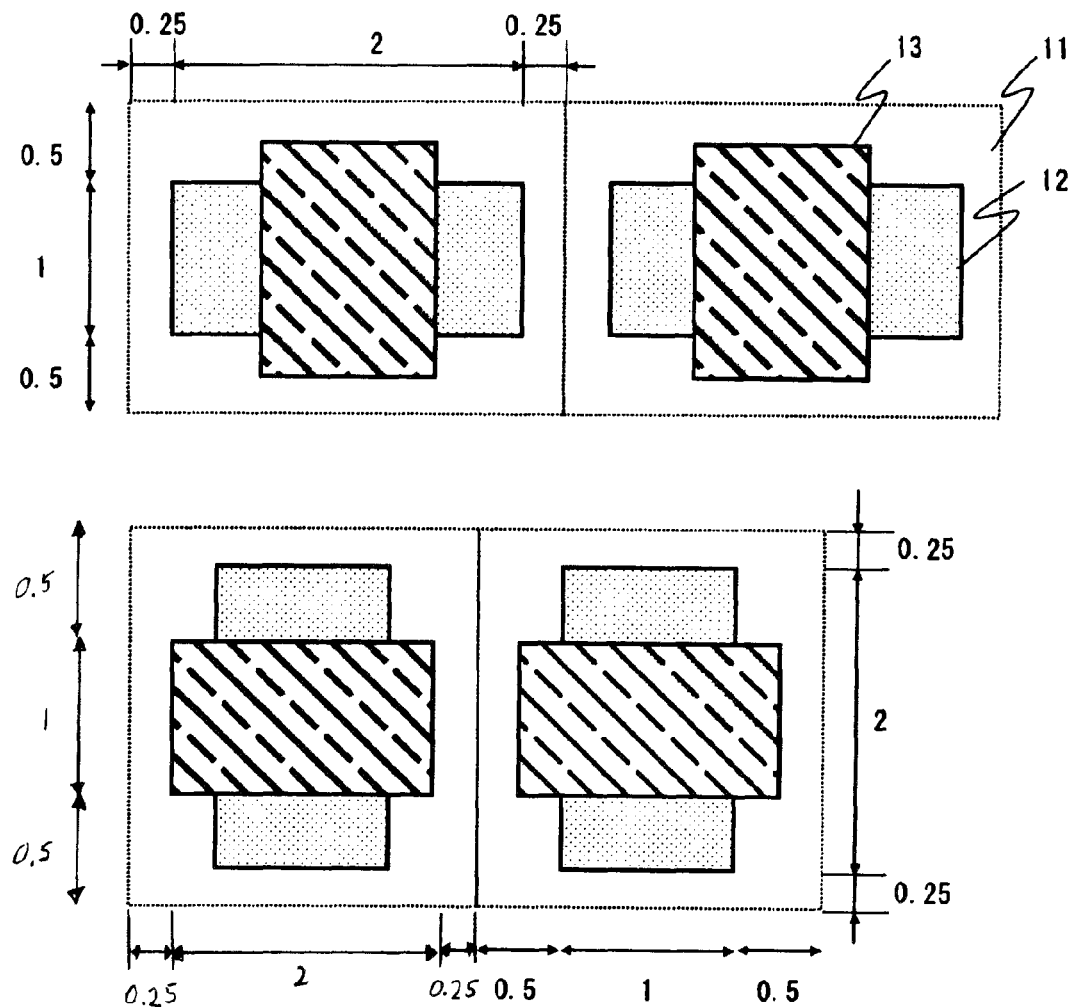
FIG. 3 shows a data rate example of dummy patterns of the semiconductor integrated circuit device of the first embodiment.

FIG. 3 shows an example of a data rate of dummy patterns in the semiconductor integrated circuit device of this embodiment.

Provided that each dummy diffusion layer (dummy diffusion region) 12 of each dummy MOSFET 11 has a dimension (rectangular size) of 1 μm (length)×2 μm (width), and a pitch between the dummy diffusion layers is 2 μm (length)×2.5 μm (width), a data rate is about 40% {(1×2)/(2×2.5)=about 40%}. Provided that each dummy gate electrode 13 of each dummy MOSFET 11 has a dimension (rectangular size) of 2 μm (length)×1 μm (width), and a pitch between the dummy gate electrodes is 2.5 μm (length)×2 μm (width), a data rate is about 40 {(2×1)/(2.5×2)=about 40%}.

In general, a problem of dishing upon CMP never occurs as long as a data rate of the dummy diffusion layers 12 and a data rate of the dummy gate electrodes 13 fall within a range of 25% to 75%.

Figure 11:
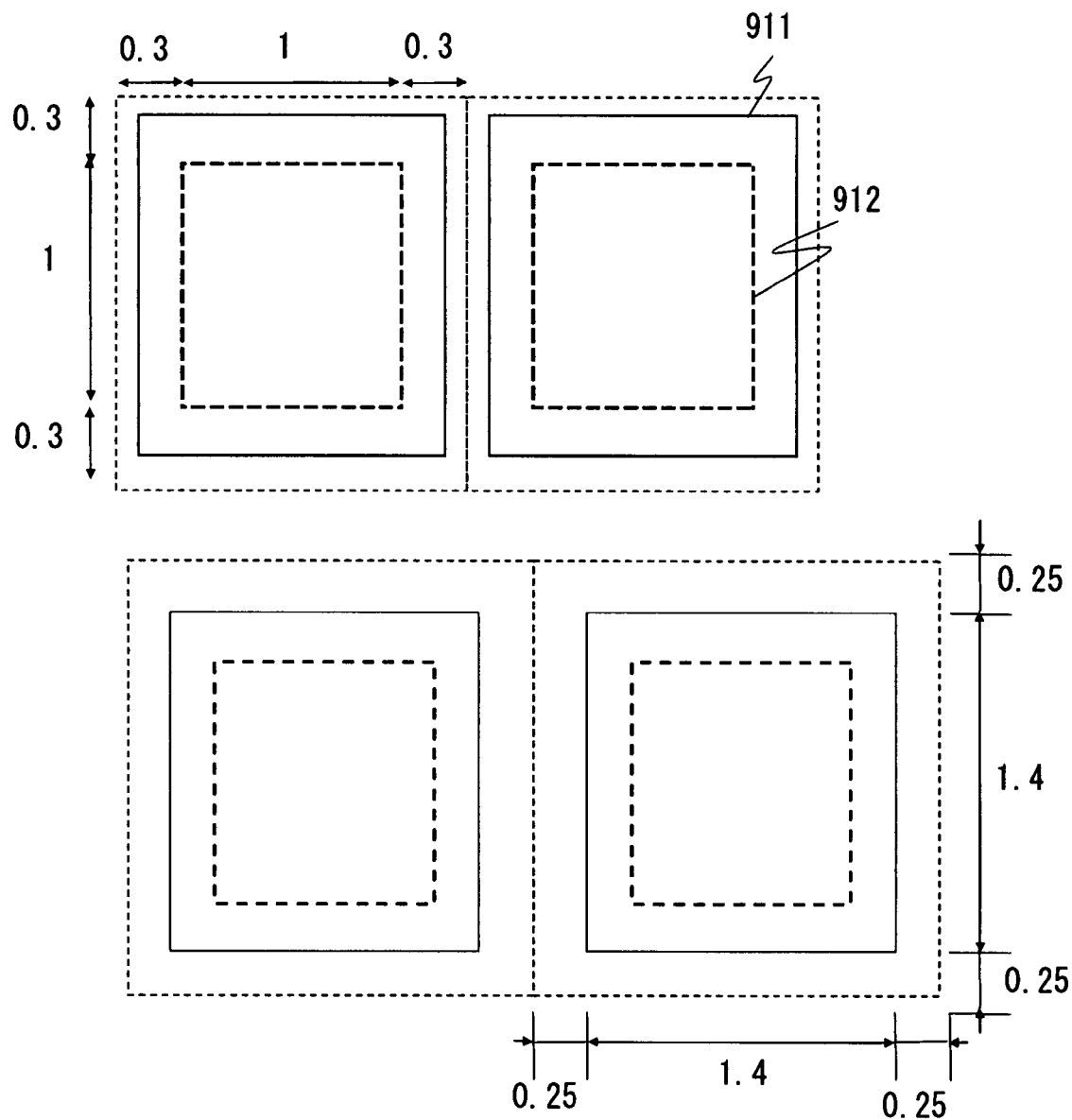
FIG. 11 shows a data rate example of dummy patterns of the conventional semiconductor integrated circuit device.

In this embodiment, patterns of the dummy MOSFET 11, which includes the dummy diffusion layers 12 and dummy gate electrodes 13, are arranged in the dummy region 10. Thus, a data rate of the dummy diffusion layers 12 and dummy gate electrodes 13 is kept constant and set within the above allowable range unlike the conventional case where the dummy diffusion layers 12 and the dummy gate electrodes 13 are separately arranged to keep a constant data rate. Incidentally, a data rate of the dummy gate electrode is about 14% smaller than that of the conventional one as shown in FIG. 11, but this value is within the allowable range and thus acceptable in terms of flatness. For example, if a higher data rate of the dummy gate electrode is desired, a gate length L may be further increased.

In the case of arranging dummy patterns with CAD in layout design of the semiconductor integrated circuit device, a pattern of the dummy MOSFETs 11 as shown in FIG. 3 is registered in a library of the CAD beforehand. For example, the functional circuit regions 20a and 20b including functional circuits (such as macro) are formed on the semiconductor substrate, and a region between the functional circuit regions 20a and 20b is used as the dummy region 10. Then, the patterns of the dummy MOSFETs 11 registered in the library are automatically arranged in the dummy region 10. The pattern is arranged at predetermined intervals as shown in FIG. 3 to hold a data rate constant.

As described above, in this embodiment, dummy MOSFET is arranged as a dummy pattern in the dummy region. A data rate of the dummy diffusion layer and dummy gate electrode is thus kept constant and the reduction in flatness upon CMP is prevented.

In particular, since dummy pattern is arranged on a dummy MOSFET basis, even if a contact is formed in the dummy diffusion layer, the data rate is not influenced. Further, in this embodiment, a contact for supplying a substrate potential or a well potential is formed in the dummy diffusion layer. By supplying a potential to the dummy diffusion layer, a substrate potential and a well potential are stabilized, and contributes to absorb carriers. Therefore, latchup is prevented.

Second Embodiment

Next, a semiconductor integrated circuit device according to a second embodiment of the present invention is described. This embodiment describes an example of how dummy MOSFETs of the first embodiment are laid out on a semiconductor chip.

Figure 4:
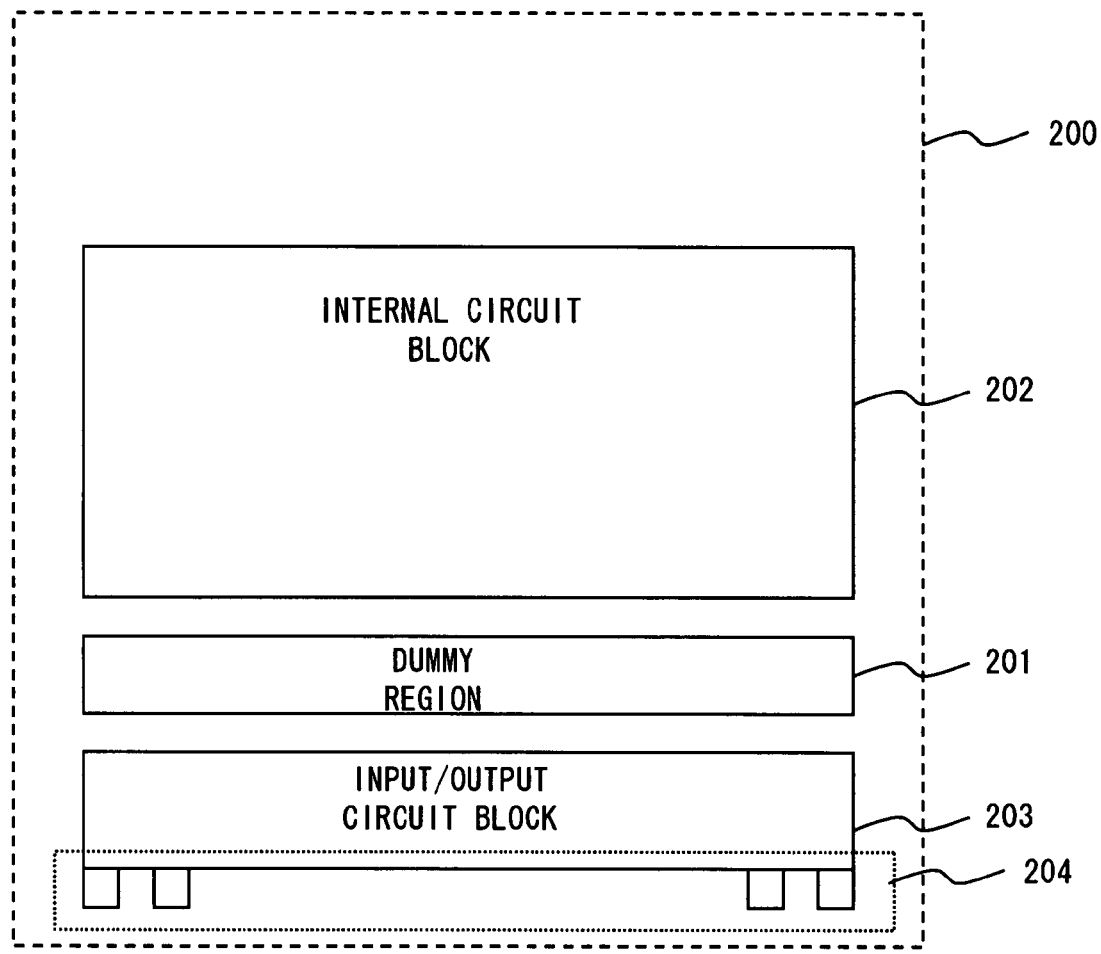
FIG. 4 is a block diagram of a semiconductor chip according to a second embodiment of the present invention.

FIG. 4 shows the structure of a semiconductor chip of this embodiment. As shown in FIG. 4, the semiconductor chip 200 includes a dummy region 201, an internal circuit block 202, an input/output circuit block 203, and an external terminal region 204. The internal circuit block 202 is placed at an inner portion of the semiconductor chip than the dummy region 201. The input/output circuit block 203 is placed at the edge portion of the semiconductor chip than the dummy region 201. The external terminal region 204 is placed at the edge portion of the semiconductor chip than the input/output circuit block 203.

In the dummy region 201, the dummy MOSFETs 11 are arranged as in the first embodiment. The internal circuit block 202 and the input/output circuit block 203 correspond to the functional circuit regions 20a and 20b of the first embodiment. For example, in the internal circuit block 202, an internal circuit that realizes a predetermined function of the semiconductor chip is provided. In the input/output circuit block 203, an input/output protective element, an output transistor, and a power supply protective element are provided. In the external terminal region 204, an external terminal (pad) that is connected with an external device electrically is provided.

Figure 5:
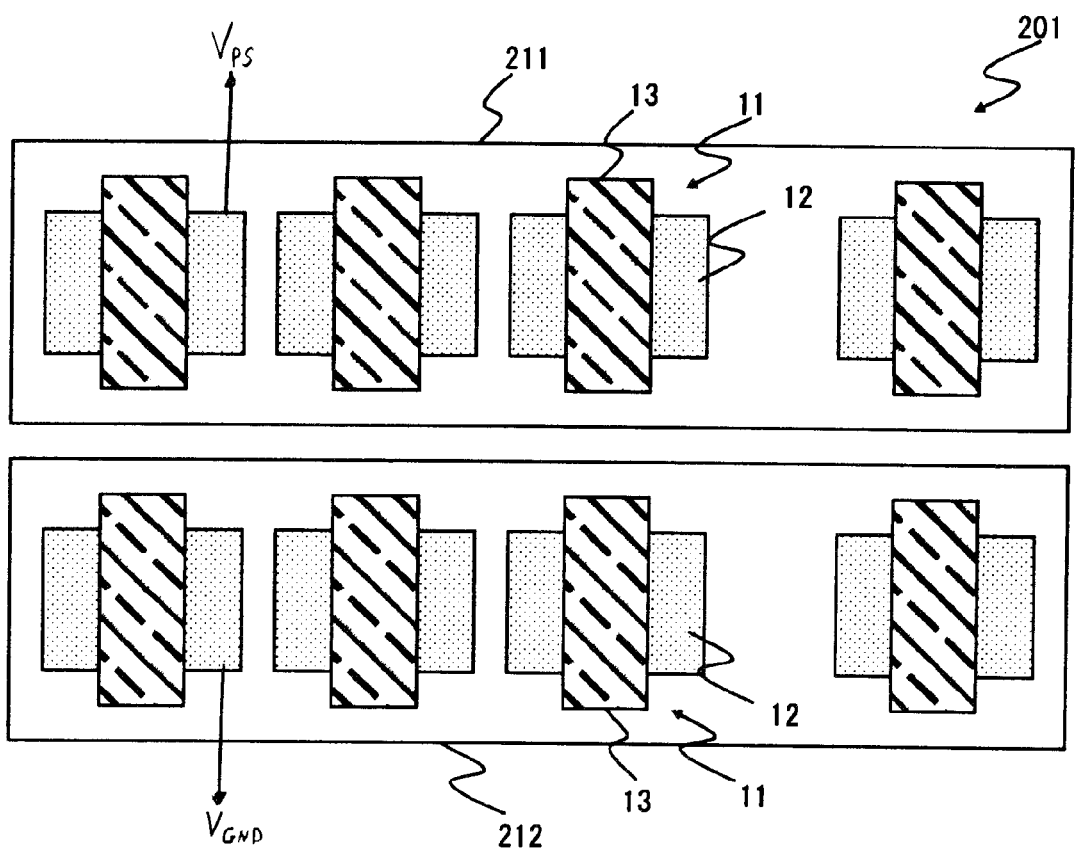
FIG. 5 shows an arrangement example of dummy patterns of the second embodiment.

FIG. 5 shows an arrangement example of the dummy MOSFETs 11 in the dummy region 201. The dummy region 201 is a region of a belt-state and is composed of plural dummy MOSFETs 11 arranged in line or an arbitrary number of lines. Incidentally, the dummy MOSFETs 11 are arranged between the internal circuit block 202 and the input/output circuit block 203. Further, the longitudinal direction of the dummy gate electrode 13 is vertical to the arrangement direction of the dummy MOSFETs 11.

In FIG. 5, the dummy MOSFETs 1 are arranged in line in both of the N-type well 211 and P-type well 212. Incidentally, the well 211 and the well 212 extend in parallel. Similar to the first embodiment, the dummy diffusion layer 12 of the well 211 is a well contact of an N+ diffusion layer; its conductivity type is the same as that of the well 211. The dummy diffusion layer 12 of the well 212 is a well contact of a P+ diffusion layer; its conductivity type is the same as that of the well 212. The dummy diffusion layer 12 of the well 211 is connected to the power supply potential $V_{PS}$. The dummy diffusion layer 12 of the well 212 is connected to a ground potential $V_{GND}$.

As described above, plural dummy MOSFETs are arranged in the dummy region, making it possible to apply a predetermined potential to a substrate or well in a predetermined region near the functional circuit region at regular intervals. As a result, latch-up can be effectively avoided.

Third Embodiment

Next, a semiconductor integrated circuit device according to a third embodiment of the present invention is described. A feature of the semiconductor integrated circuit device of this embodiment is that plural dummy MOSFETs are arranged in a dummy region on a dummy MOSFET basis, and the dummy MOSFET is a spare element.

Figure 6:
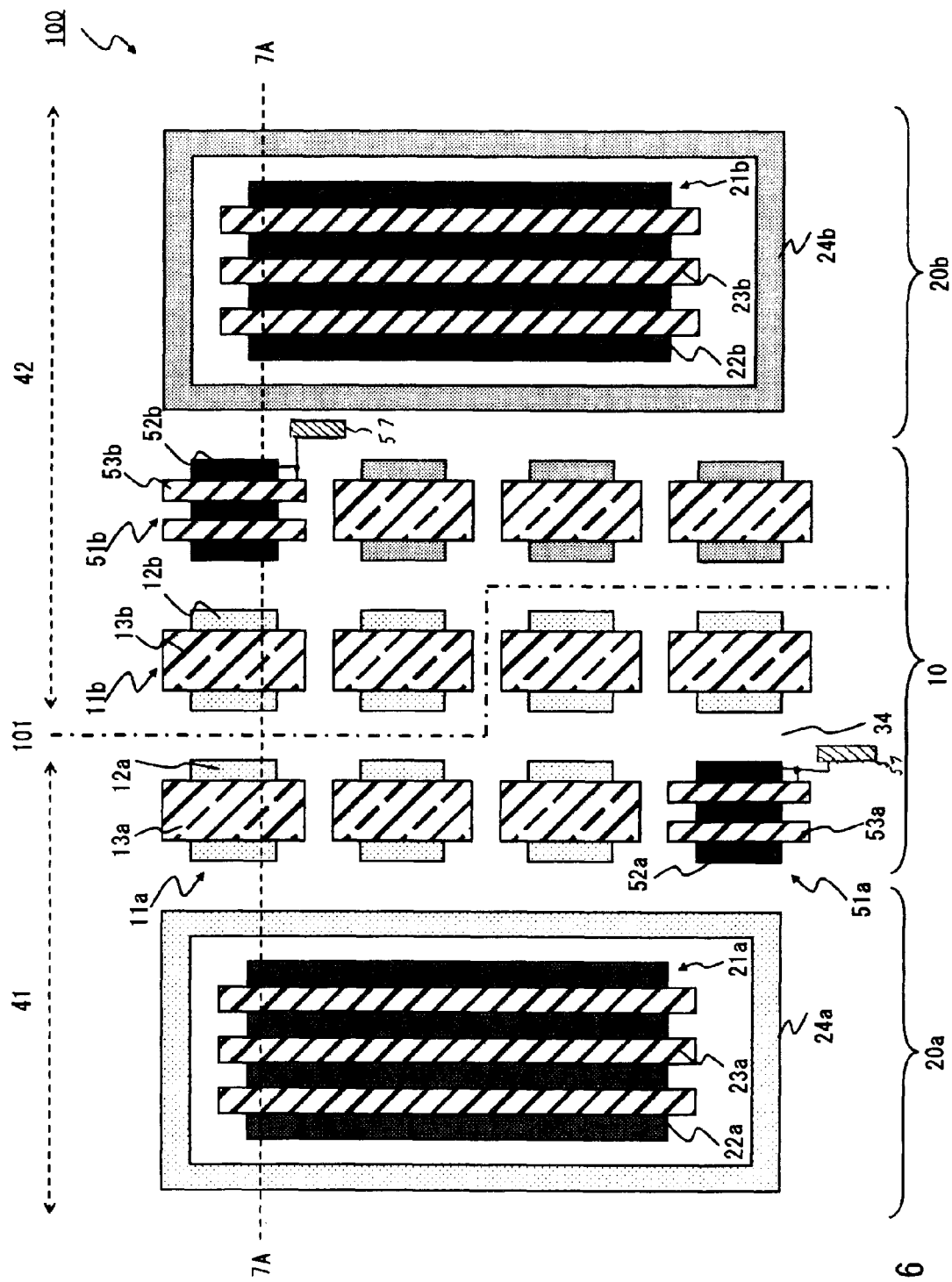
FIG. 6 is a plan view of a semiconductor integrated circuit device according to a third embodiment of the present invention.
Figure 7:
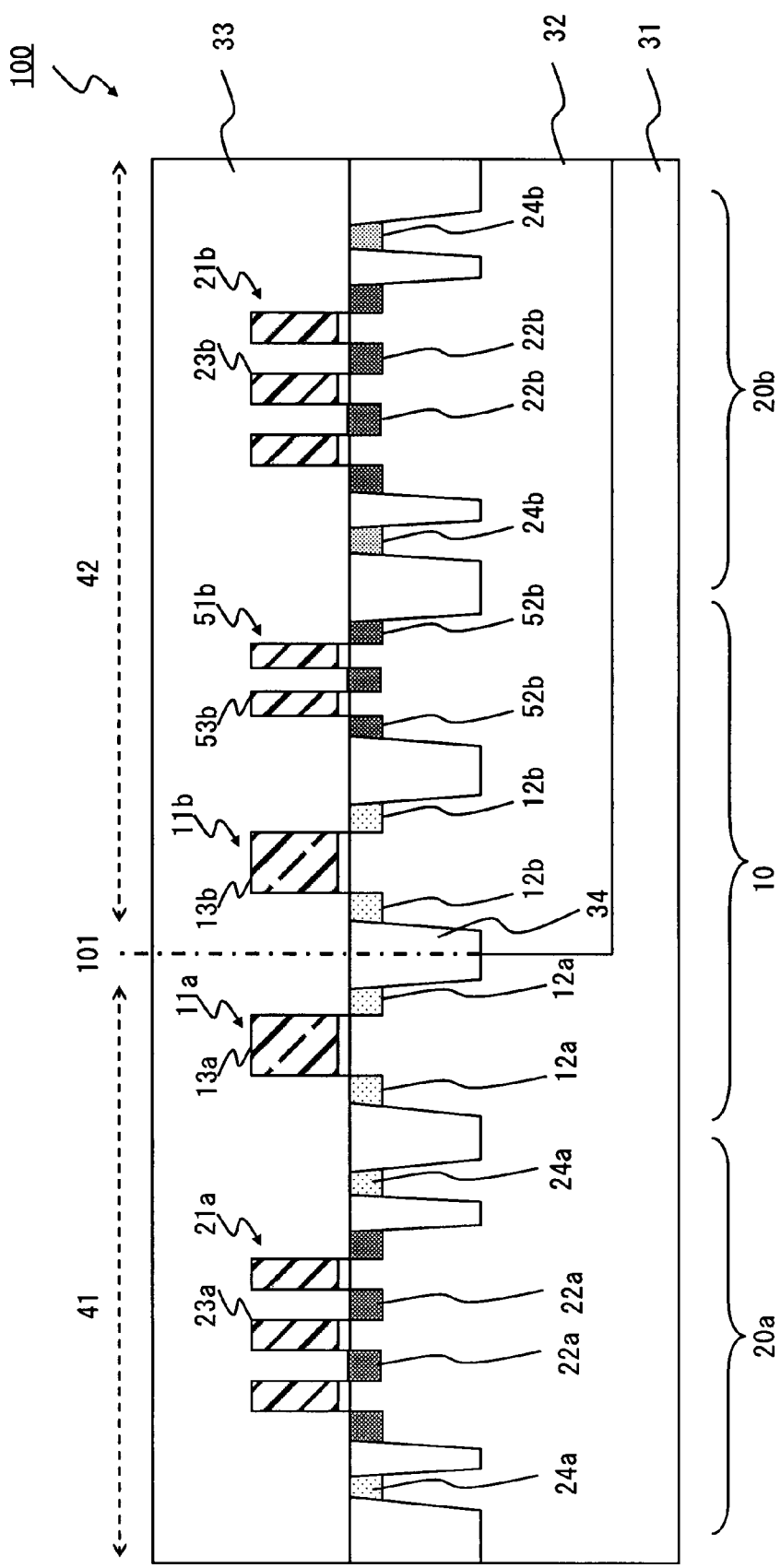
FIG. 7 is a sectional view of the structure of the semiconductor integrated circuit device of the third embodiment.

Referring to FIGS. 6 and 7, the structure of the semiconductor integrated circuit device of this embodiment is described. FIG. 6 is a plan view of the semiconductor integrated circuit device 100. FIG. 7 is a sectional view taken along the line 7A-7A of FIG. 6. Incidentally, in FIGS. 6 and 7, the same components as those of FIGS. 1 and 2 are denoted by identical reference numerals.

As in the first embodiment, the plural dummy MOSFETs 11 are arranged in the dummy region 10. In this embodiment, some of the dummy MOSFETs are referred to as auxiliary elements (sub elements) 51 (51*a* and 51*b*). The auxiliary elements operate as a component of a functional circuit and realize a predetermined function together with elements in the functional circuit when connected to the functional circuit.

The auxiliary elements 51 include dummy diffusion layers 52 (52*a* and 52*b*) and dummy gate electrodes 53 (53*a* and 53*b*) similar to the other dummy MOSFETs 11. In this embodiment, the dummy diffusion layers 52 have a conductivity type opposite to that of the semiconductor substrate 31 or well 32. Thus, the auxiliary elements 51 are operable as MOSFETs. Further, a size (gate length or gate width) of the dummy gate electrodes 53 is changed. For example, the dummy diffusion layer 52*a* is an N-type diffusion layer; its conductivity type is opposite to that of the semiconductor substrate 31. The dummy diffusion layer 52*b* is P-type diffusion layer opposite to the well 32. That is, the auxiliary element 51*a* is an N-type MOSFET. The auxiliary element 51*b* is a P-type MOSFET.

In the auxiliary elements 51, the dummy diffusion layer 52 and the dummy gate electrode 53 are connected to metal wiring 57 through a contact (not shown), not metal wiring of the functional circuit. The dummy diffusion layer 52 and the dummy gate electrode 53 are connected to the metal wiring of the functional circuit optionally upon circuit modification, and operate as a component of the MOSFET of the functional circuit. For example, the metal wiring 57 of the auxiliary elements 51 is connected to the functional circuit in accordance with change in mask pattern in a metal wiring formation step. Alternatively, the metal wiring 57 of the auxiliary elements 51 is connected with the other metal wiring in a step subsequent to the metal wiring formation step.

The auxiliary elements 51 are applicable to various functional circuits. For example, if connected with a functional circuit, the auxiliary elements 51 can be used to change the logic of a logic circuit, change a signal transmission rate, change an oscillation frequency or period, change a detection level of a detector circuit, change a reference level of a reference circuit, and switch circuit blocks. Further, plural auxiliary elements 51 may be used to previously prepare a basic circuit such as an inverter circuit or a NAND circuit.

As a result of arranging the auxiliary elements 51 into patterns of the MOSFET structure to configure a circuit, a data rate is somewhat limited. However, as in the first embodiment, the requisite flatness can be obtained after CMP insofar as a data rate of about 25% to 75% is ensured. For example, to keep a data rate constant, a size of each dummy diffusion layer or dummy gate electrode in the dummy MOSFETs 11 other than the auxiliary element 51 may be adjusted. Incidentally, one dummy MOSFET may be used as a spare element operable as a MOSFET and the other dummy MOSFET may be used as a contact for supplying a predetermined potential as in the first embodiment.

FIGS. 8A to 8E show an example of MOSFET patterns of the auxiliary elements 51. Incidentally, the auxiliary elements 51 are illustrated herein, but the same holds true for the other dummy MOSFETs 11.

Figure 8A:
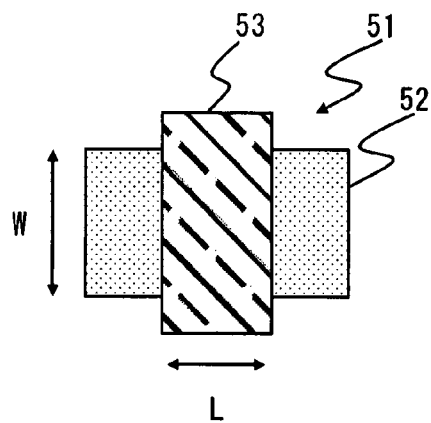
FIGS. 8A to 8E show a shape example of dummy patterns of the third embodiment.
Figure 8B:
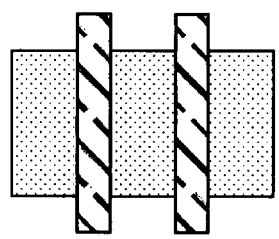
Figure 8C:
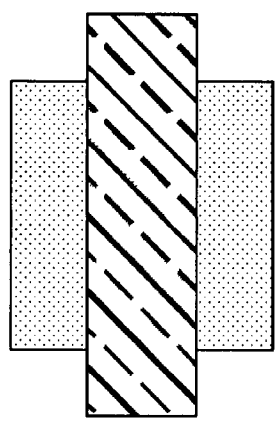
Figure 8D:
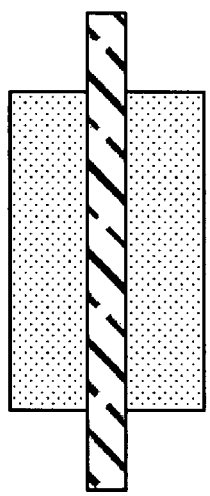
Figure 8E:
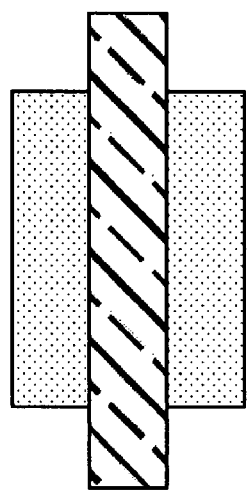
Figure 9:
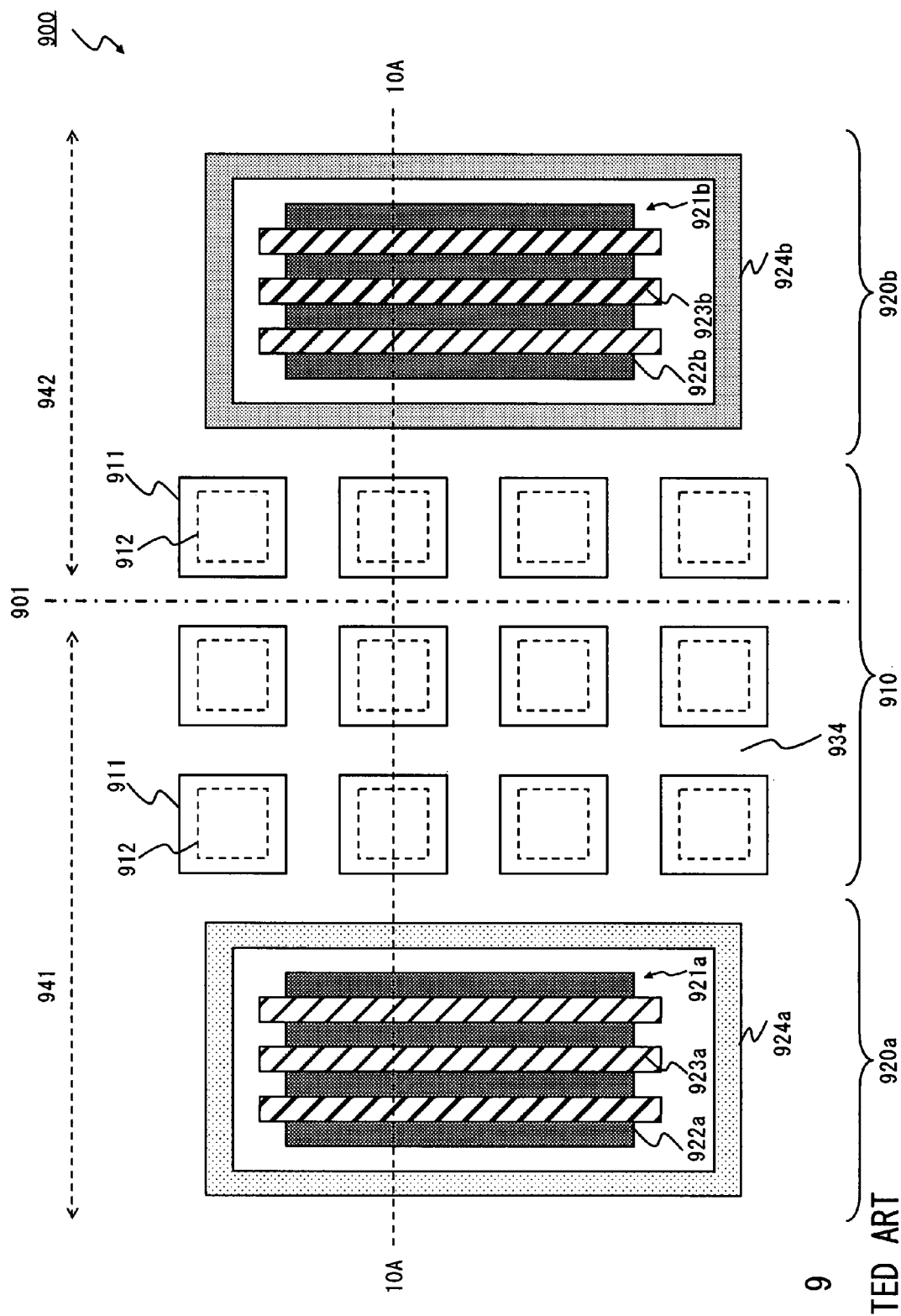
FIG. 9 is a plan view of the structure of a conventional semiconductor integrated circuit device.
Figure 10:
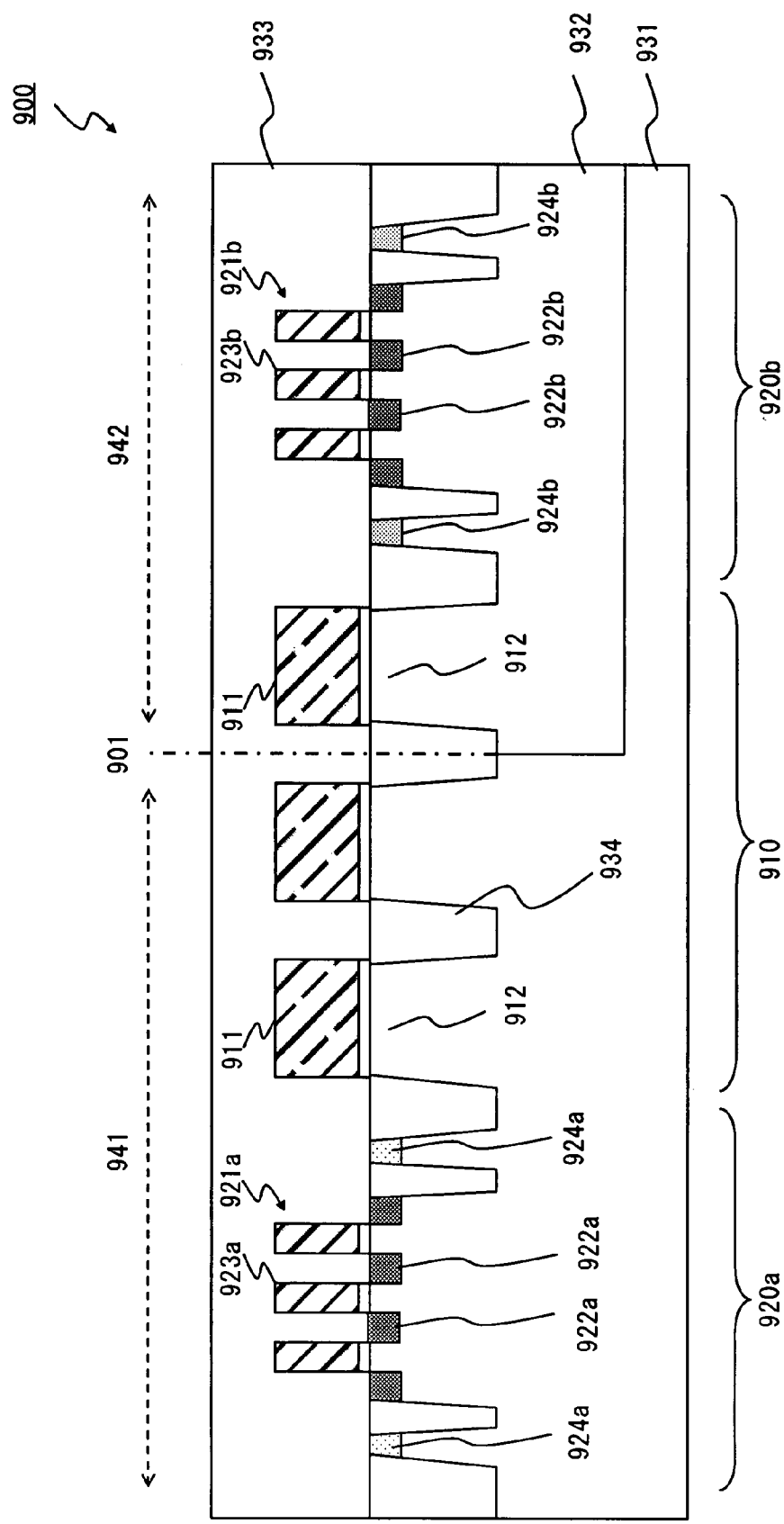
FIG. 10 is a plan view of the structure of the conventional semiconductor integrated circuit device.

As shown in FIGS. 8A to 8E, plural kinds of auxiliary elements 51 different in MOSFET gate length L/gate width W are prepared to realize a predetermined function. For example, a pattern of FIG. 8A is a reference auxiliary element 51 pattern. FIG. 8B shows an example where two dummy gate electrodes 53 having a gate length L smaller than that of FIG. 8A are provided. FIG. 8C shows an example where a gate width W is larger than that of FIG. 8A. FIG. 8D shows an example where the gate length L is shorter and the gate width is longer than those of FIG. 8A. FIG. 8E shows an example where the gate length L is larger than that of FIG. 8D.

As described above, in this embodiment, similar to the first embodiment, dummy MOSFETs are arranged in the dummy regions to prevent flatness from lowering upon CMP. Further, in this embodiment, the dummy MOSFET is a spare element operable as the MOSFET, so elements in the functional circuit region is not needed. Accordingly, it is unnecessary to provide a spare element in the functional circuit region, and a circuit area of the semiconductor chip can be reduced.

Incidentally, the present invention is not limited to the MOSFET structure where an $SiO_2$ film is used as an insulating film, but a high-dielectric-constant insulating film or a composite insulating film may be used. A gate electrode material or substrate structure may be arbitrarily determined. Further, patterns may be formed in consideration of a data rate in a step subsequent to a gate electrode formation step (for example, metal wiring formation step).

It is apparent that the present invention is not limited to the above embodiment that may be modified and changed without departing from the scope and spirit of the invention.

What is claimed is:

1. A semiconductor integrated circuit device, comprising:
    a functional circuit region formed on a semiconductor substrate;
    a dummy region formed on the semiconductor substrate; and a plurality of dummy MOSFETs arranged in the dummy region, each of the dummy MOSFETs having a dummy diffusion region and a dummy gate electrode region, wherein a first data rate of the dummy diffusion region arranged in a predetermined section and a second data rate of the dummy gate electrode region arranged in the predetermined section is substantially constant, wherein at least one of the plurality of dummy MOSFETs is a spare element connected to the functional circuit of the functional circuit region and operating as a component of the functional circuit.

2. The semiconductor integrated circuit device according to claim 1, wherein the plurality of dummy MOSFETs are arranged at substantially regular intervals in the dummy region.

3. The semiconductor integrated circuit device according to claim 1, wherein the plurality of dummy MOSFETs are arranged regularly and two-dimensionally in the dummy region.

4. The semiconductor integrated circuit device according to claim 1, wherein a size of the dummy diffusion region of the dummy MOSFET is substantially equal to a size of the dummy gate electrode of the dummy MOSFET as viewed from above.

5. The semiconductor integrated circuit device according to claim 1, wherein the dummy region is provided between adjacent functional circuit regions.

6. The semiconductor integrated circuit device according to claim 1, wherein the dummy diffusion region of the dummy MOSFET extends in a same direction as that of a diffusion region of a MOSFET in the functional circuit region, and
the dummy gate electrode of the dummy MOSFET extends in a same direction as that of a gate electrode of a MOSFET in the functional circuit region.

7. The semiconductor integrated circuit device according to claim 1, wherein the first data rate of the dummy diffusion region of the dummy MOSFET and the second data rate of the dummy gate electrode of the dummy MOSFET is within a range of 25% to 75% in the predetermined section.

8. The semiconductor integrated circuit device according to claim 1, wherein the dummy diffusion region of one of the plurality of dummy MOSFETs is connected to a predetermined reference potential.

9. The semiconductor integrated circuit device according to claim 8, wherein the predetermined reference potential is a substrate potential or a well potential.

10. The semiconductor integrated circuit device according to claim 1, wherein the dummy gate electrode of one of the plurality of dummy MOSFETs is connected to a predetermined potential.

11. The semiconductor integrated circuit device according to claim 1, wherein a dummy MOSFET having a P-type diffusion region among the dummy diffusion regions is formed in an N-type semiconductor substrate or N-type well, and
a dummy MOSFET having an N-type diffusion region among the dummy diffusion regions is formed in a P-type semiconductor substrate or P-type well.

12. The semiconductor integrated circuit device according to claim 1, wherein the dummy diffusion region and gate electrode of the plurality of dummy MOSFETs are connected to metal wiring, and
the metal wiring is connected to the functional circuit.

13. The semiconductor integrated circuit device according to claim 12, wherein the metal wiring is connected to the functional circuit due to a change of a mask pattern in a metal wiring step of forming the metal wiring or connected to the functional circuit in a step after the metal wiring step.

14. A semiconductor integrated circuit device, comprising:
a functional circuit region formed on a semiconductor substrate;
a dummy region formed on the semiconductor substrate; and
a plurality of dummy MOSFETs arranged in the dummy region, each of the dummy MOSFETs having a dummy diffusion region and a dummy gate electrode region,
wherein a first data rate of the dummy diffusion region arranged in a predetermined section and a second data rate of the dummy gate electrode region arranged in the predetermined section is substantially constant,
wherein a P-type diffusion region among the dummy diffusion regions of the plurality of dummy MOSFETs is connected to a ground potential, and
an N-type diffusion region among the dummy diffusion regions of the plurality of dummy MOSFETs is connected to a power supply potential.

15. A semiconductor integrated circuit device, comprising:
a functional circuit region formed on a semiconductor substrate;
a dummy region formed on the semiconductor substrate; and
a plurality of dummy MOSFETs arranged in the dummy region, each of the dummy MOSFETs having a dummy diffusion region and a dummy gate electrode region,
wherein a first data rate of the dummy diffusion region arranged in a predetermined section and a second data rate of the dummy gate electrode region arranged in the predetermined section is substantially constant,
wherein a dummy MOSFET having a P-type diffusion region among the dummy diffusion regions is formed in a P-type semiconductor substrate or a P-type well, and
a dummy MOSFET having an N-type diffusion region among the dummy diffusion regions is formed in an N-type semiconductor substrate or N-type well.

16. A dummy pattern arrangement method, comprising:
arranging a functional circuit region on a semiconductor substrate;
arranging a plurality of dummy MOSFETs in a dummy region on the semiconductor substrate, each of the dummy MOSFETs having a dummy diffusion region and a dummy gate electrode region, and the plurality of dummy MOSFETs are arranged in a manner such that a first data rate of the dummy diffusion region arranged in a predetermined section and a second data rate of the dummy gate electrode region arranged in the predetermined section is set substantially constant; and
operating at least one of the plurality of dummy MOSFETs as a component of the functional circuit,
wherein at least one of the plurality of dummy MOSFETs is a spare element connected to the functional circuit of the functional circuit region.

17. The dummy pattern arrangement method according to claim 16, wherein the plurality of dummy MOSFETs are arranged at substantially regular intervals in the dummy region.

18. The dummy pattern arrangement method according to claim 16, wherein a size of the dummy diffusion region is substantially equal to a size of the dummy gate electrode as viewed from above.

19. The dummy pattern arrangement method according to claim 16, wherein a plurality of dummy MOSFETs are arranged between adjacent functional circuit regions.

* * * * *